United States Patent [19]

Gehring

[11] 4,438,347

[45] Mar. 20, 1984

[54] DEVICE FOR CHANGING THE ELECTRICAL CIRCUIT CONFIGURATION OF INTEGRATED SEMICONDUCTOR CIRCUITS

[75] Inventor: Gerhard Gehring, Unterhaching, Fed. Rep. of Germany

[73] Assignee: Siemens Aktiengesellschaft, Berlin and Munich, Fed. Rep. of Germany

[21] Appl. No.: 291,112

[22] Filed: Aug. 7, 1981

[30] Foreign Application Priority Data

Aug. 13, 1980 [DE] Fed. Rep. of Germany ....... 3030620

[51] Int. Cl.³ .................. H01L 27/01; H03H 2/00
[52] U.S. Cl. .................................. 307/308; 307/303; 357/74
[58] Field of Search .................. 307/303, 304, 308; 357/84, 86, 74

[56] References Cited

U.S. PATENT DOCUMENTS 3,758,745 9/1973 Wilker et al.
3,820,152 6/1974 Booth ................................. 357/74
4,100,437 7/1978 Hoff ................................... 307/304
4,104,546 8/1978 Seiler ................................. 307/303
4,225,878 9/1980 Dobkin ............................... 357/86

OTHER PUBLICATIONS

Mikropack—Integriert Schaltungen Vom Band—Bauteile report 16 (1978), No. 2, pp. 40 to 44 by Detlev Schmitter.

*Primary Examiner*—John S. Heyman
*Attorney, Agent, or Firm*—Herbert L. Lerner; Laurence A. Greenberg

[57] ABSTRACT

Device for changing the electrical circuit configuration of integrated semiconductor circuits on chips for the adjustment and trimming of circuit parameters, including circuit connections selectively disposed in the circuit configuration of the integrated semiconductor circuits, the circuit connections being accessible from outside the circuit chips and being mechanically openable without mechanically and without electrically stressing and modifying the circuit chips.

5 Claims, 6 Drawing Figures

DEVICE FOR CHANGING THE ELECTRICAL CIRCUIT CONFIGURATION OF INTEGRATED SEMICONDUCTOR CIRCUITS

The present invention relates to a device for changing the electrical circuit configuration of integrated semiconductor circuits for the adjustment and trimming of circuit parameters such as references, thresholds, zero errors (offset voltages) or function reversal.

In completed semiconductor circuit systems, circuit parameters of the above-mentioned kind are practically no longer adjustable by an intervention in the system. A circuit system is understood in this context to mean the semiconductor body containing the electrical functioning units of a circuit, including the conductor runs on it for the electrical interconnection of the various functional units and contact electrodes for making contact with external leads. In other words, the circuit system is the finished integrated semiconductor circuit without external leads and without a housing.

Due to unavoidable stored or locked-up mechanical stresses or supply, it is, particularly, piezo-resistive effects which occur in the components of all integrated semiconductor circuits, and especially those formed of silicon. The locked-up mechanical stresses occur, for example, when assembling the circuit systems in a housing. Such piezo effects are also particularly strong in integrated semiconductor circuits in which Hall-effect generators are co-integrated as sensors, because such integrated semiconductor circuits are relatively large and the Hall-effect generators emit relatively small useful signals so that subsequent amplifiers are required in all cases. Consequently, in integrated semiconductor circuits with integrated Hall-effect generators, the piezo-effects lead to very disagreeable scattering of the magnetic levels. The problem is all the more serious since an accurate premeasurement is not possible on the system because subsequent assembly steps can change the locked-up mechanical stresses.

Until now, this problem has been solved by assembling such devices as free of locked-up stress as possible, by covering the semiconductor circuit systems with suitable materials such as Sylgard, or by selecting particular semiconductor circuits.

However, if such semiconductor circuits are processed further in other housings to provide a larger subassembly, new locked-up mechanical stresses can occur. An example of such further processing of an integrated circuit in another housing is the construction of a magnetic barrier with a magnetic field-controlled, integrated semiconductor circuit containing a Hall-effect generator as a magnetic sensor.

However, it is not only a problem to compensate interfering influences such as the hereinafore-mentioned stored or locked-up mechanical stresses, but it is also desirable to be able to make certain parameters variable, such as the above-mentioned references, thresholds, or a function reversal, perhaps a phase reversal, and to do so at little expense, and in particular without affecting the circuit system itself.

It is accordingly an object of the invention to provide a device for changing the electrical circuit configuration of integrated semiconductor circuits which overcomes the hereinafore-mentioned disadvantages of the heretofore-known devices of this general type, and to create a simple way of adjustment and trimming of circuit parameters in integrated circuits.

With the foregoing and other objects in view there is provided, in accordance with the invention, a device for changing the electrical circuit configuration of integrated semiconductor circuits on chips for the adjustment and trimming of circuit parameters such as references, thresholds, zero errors (offset voltages) or function reversal, comprising circuit connections selectively disposed in the circuit configuration of the integrated semiconductor circuits, the circuit connections being accessible from outside the circuit chips and being mechanically operable without mechanically or electrically stressing or modifying the circuit chips.

In accordance with another feature of the invention, there is provided on operational amplifier having a negative feedback circuit, a voltage divider network having resistors disposed in the feedback circuit and having a given voltage division ratio, the circuit connections being in the form of bridges being connected to the divider resistors and being mechanically openable for varying the given voltage division ratio for selective adjustment of predetermined feedback values.

In accordance with a further feature of the invention there is provided a circuit component being switchable between at least two operating modes or functions, the circuit connections being connected in the component for transforming or switching from one of the operating modes to another by opening the circuit connections which are accessible from outside a circuit chip.

In accordance with an added feature of the invention, the operating modes are operated as a single-ended circuit and as a push-pull circuit or a common-emitter circuit and as a common-collector circuit.

In accordance with an additional feature of the invention, there is provided an amplifier having an output signal with a given phase and a normally phase-rotating amplifier stage, the circuit connection being in the form of a short-circuit connector connected to the amplifier stage for cancelling the phase rotation and being mechanically openable for introducing phase shifts.

In accordance with again another feature of the invention, there is provided an integrated semiconductor circuit having electrical interference signals caused by stored mechanical stresses or supply, an evaluation circuit following the semiconductor circuit, and a balancing resistor network disposed in the evaluation circuit, the circuit connections being in the form of bridges connected to resistors of the resistor network and being mechanically openable for selectively adjusting resistance values of the resistor network and compensating the interference signals.

In accordance with again a further feature of the invention, the semiconductor circuit is a magnetic field-controlled circuit having a Hall-effect generator as a magnetic-electrical sensor, and the evaluation circuit is an amplifier.

In accordance with again an added feature of the invention, the evaluation circuit is an amplifier having a load circuit and the resistor network is disposed in the load circuit.

In accordance with again an additional feature of the invention, there is provided a micropack in which the integrated circuit is mounted, contact pads disposed in the micropack and conductor runs leading to the contact pads, the circuit connections being operable to disconnect the conductor runs for the selective adjustment of resistance values of the balancing resistor network.

In accordance with a concomitant feature of the invention, there is provided a non-magnetic metal cap disposed in the micropack covering the integrated circuit.

Other features which are considered as characteristic for the invention are set forth in the appended claims.

Although the invention is illustrated and described herein as embodied in device for changing the electrical circuit configuration of integrated semiconductor circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
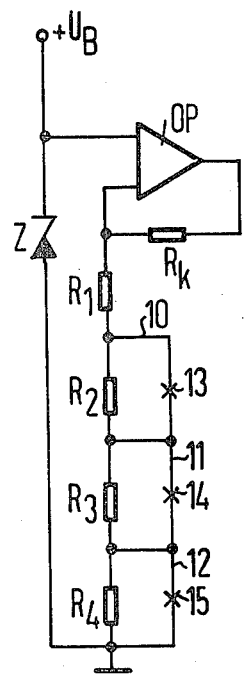
FIG. 1 is a schematic circuit diagram of an integrated circuit in the form of a degenerative operational amplifier with a capability of selective adjustment of predetermined feedback values.

Referring now to the figures of the drawing and first particularly to FIG. 1 thereof, it is seen that one input of an operational amplifier OP is connected to a Zener diode Z by way of which a reference potential is adjusted through an operating or supply voltage $+U_B$. Another input of the operational amplifier OP is connected to the output of the operational amplifier OP through a negative-feedback resistor $R_K$.

For the selective adjustment of given negative feedback values, the negative-feedback input of the operational amplifier OP is connected to ground through a voltage divider formed by resistors $R_1$ to $R_4$. Each one of the resistors $R_2$, $R_3$ and $R_4$ is bridged by a short-circuit bridge 10, 11, 12, respectively. In an integrated embodiment of the fed-back operational amplifier, these short-circuit bridges 10 to 12 are accessible and mechanically disconnectable outside of the circuit chip containing this amplifier. These disconnects are each indicated diagrammatically by an "X" 13, 14, 15, respectively. Depending on the combination in which the short-circuit bridges 10 to 12 are disconnected, different divider ratios will result in the voltage divider $R_1$ to $R_4$, so that different feedback values may be adjusted.

Figure 2:
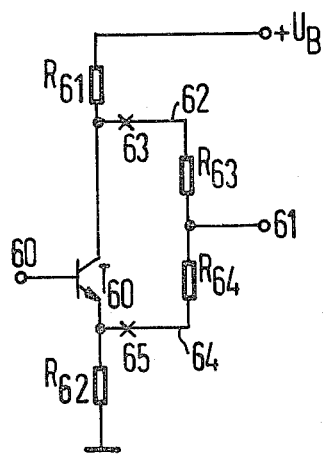
FIG. 2 is a schematic circuit diagram of a circuit arrangement in which the function of a circuit component can be transformed from one function mode to another by disconnecting circuit connectors.

FIG. 2 shows a transistor amplifier stage with a transistor $T_{60}$ which is driven by an input 60 and has a collector circuit containing a resistor $R_{61}$ connected to the supply voltage $+U_B$, while its emitter circuit contains a resistor $R_{62}$. Between the collector and emitter of the transistor $T_{60}$, the series connection of two resistors $R_{63}$ and $R_{65}$ is connected through connecting lines 62 and 64. The connecting point of the two resistors $R_{63}$ and $R_{64}$ forms an output 61 of the transistor amplifier stage.

Normally, this transistor amplifier stage works as a push-pull stage. By disconnecting one of the two connecting lines 62 or 64, this transistor amplifier stage can be transformed into a single-ended stage in common-emitter connection (by a disconnect at a point 65), or into an emitter follower (by a disconnect at a point 63).

Figure 3:
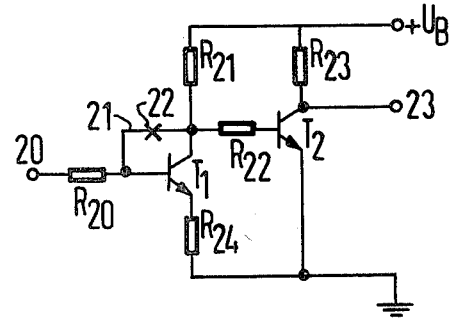
FIG. 3 is a schematic circuit diagram of an integrated amplifier with a capability of adjusting the phase of its output signal.

FIG. 3 shows an embodiment of a two-stage amplifier in which the amplifier stages are formed by a transistor $T_1$ with a load resistance $R_{21}$ and a transistor $T_2$ with a load resistance $R_{23}$. The operating points of the amplifier stages are set by a voltage $U_B$ through the resistors $R_{21}$ and $R_{23}$. From an input 20, an input signal is coupled into the amplifier through a resistor $R_{20}$. A negative feedback resistor $R_{24}$ is inserted in the emitter circuit. The first amplifier stage is coupled from the collector of the transistor $T_1$ through a resistor $R_{22}$ to the base of the transistor $T_2$ of the second amplifier stage. An output signal of the amplifier can be taken off at an output 23.

Between the collector and the base of the transistor $T_1$ there is provided a short-circuit bridge 21 which, if the amplifier is integrated, is accessible and mechanically disconnectable from outside the circuit chip containing the amplifier. This disconnecting possibility is indicated schematically by an "X" 22.

Depending on whether or not the short-circuit connector or bridge 21 is disconnected, a 180° phase difference results at the output of the first amplifier stage, i.e. at the collector of the transistor $T_1$. This phase difference is transmitted to the output 23 through the second amplifier stage with the transistor $T_2$, so that a phase reversal is realizable at the output 23 by mechanically disconnecting the short-circuit connector 21.

Figure 4:
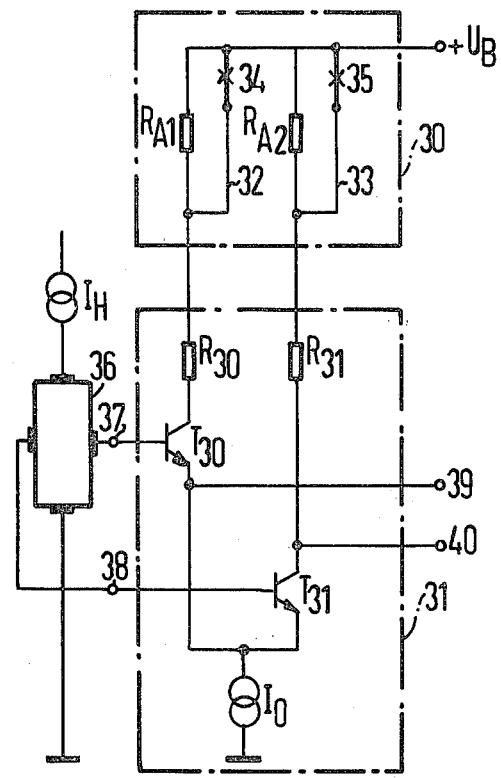
FIG. 4 is a diagrammatic and schematic circuit diagram of an embodiment of the device according to the invention with a differential amplifier succeeding a Hall-effect generator, and with a balancing resistor network.

FIG. 4 shows a circuit arrangement with a Hall-effect generator 36 having a control circuit which is fed by a control current from a current source $I_H$. A magnetic field to be determined can permeate the Hall-effect generator 36 in a non-illustrated manner, such as perpendicular to the drawing plane. Since the operation of Hall generators is basically known, the wiring is shown in principle only. For the same reason it is unnecessary to describe the generator operation. The Hall path of the Hall generator 36 is coupled to the inputs 37 and 38 of a differential amplifier 31, which contains two transistors $T_{30}$ and $T_{31}$ having emitters that are coupled directly to each other, and are jointly connected to a current source $I_O$. A load resistor $R_{30}$ and $R_{31}$, respectively, is inserted into the collector circuits of each of the transistors $T_{30}$ and $T_{31}$. The connecting point between the resistor $R_{31}$ and the collector of the transistor $T_{31}$ forms an output 40 of the differential amplifier, and the connecting point between the transistor $T_{30}$ and the current source $I_O$ forms another output 39.

According to the invention, an adjusting resistor network 30, formed by resistors $R_{A1}$ and $R_{A2}$ as well as bridges 32 and 33 for these resistors, is contained in the collector circuits of the transistors $T_{30}$ and $T_{31}$. In addition, the adjusting resistor network 30 is connected to a supply voltage $+U_B$ for the differential amplifier 31.

The circuit arrangement described above can be integrated as a whole in a semiconductor circuit in which the hereinafore-mentioned piezo effects can occur due to the stored or locked-up mechanical stresses or supply of the semiconductor circuit. In order to be able to compensate the electrical interference signals or level shifts caused by such locked-up mechanical stresses or potential, the bridges 32 and 33 for the resistors $R_{A1}$ and $R_{A2}$ in the adjusting resistor network 30 can be opened selectively. This is indicated diagrammatically by crosses 34 and 35 in the bridges 32 and 33. This makes it possible for the loop of the differential amplifier 31 to include either the resistor $R_{A1}$ only, the resistor $R_{A2}$ only, or both resistors, in order to be able to balance out electrical interference signals or level shifts caused by locked-up mechanical stresses or supply. This is possible after the assembly of the semiconductor system containing the circuit, if the electrical interference corresponding to the mechanical disturbances are determined after testing the circuit. After assembling the semiconductor circuit system in a housing it may be assumed that mechanical stresses are no longer being exerted on the housing and the semiconductor circuit system.

Figure 5:
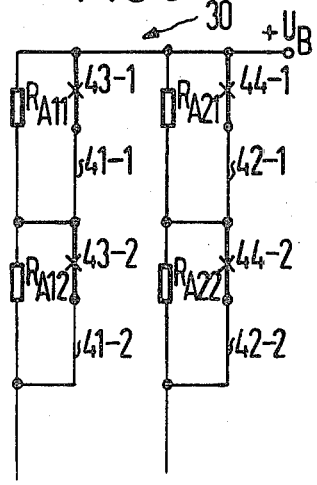
FIG. 5 is a schematic circuit diagram of another embodiment of a balancing resistor network.

To provide a possibility for finer compensating, the compensating resistor network may also be of a more complex construction. Such a possibility is shown in FIG. 5. In this embodiment, the compensating resistor network 30 contains two resistors $R_{A11}$, $R_{A12}$ and $R_{A21}$, $R_{A22}$ in each branch, respectively, with a bridge 41-1, 42-2 and 42-1, 42-2, respectively, for each resistor, so that four possible openings 43-1, 43-2 and 44-1, 44-2, respectively, are then provided.

In the compensating resistor network, there may also be provided selected resistance intervals similar to the steps of an analog-to-digital converter, i.e. 1 R, 2 R, 4 R, etc., for instance, so that 8 steps may be provided with three disconnect points, and correspondingly 16 steps with four disconnect points.

Figure 6:
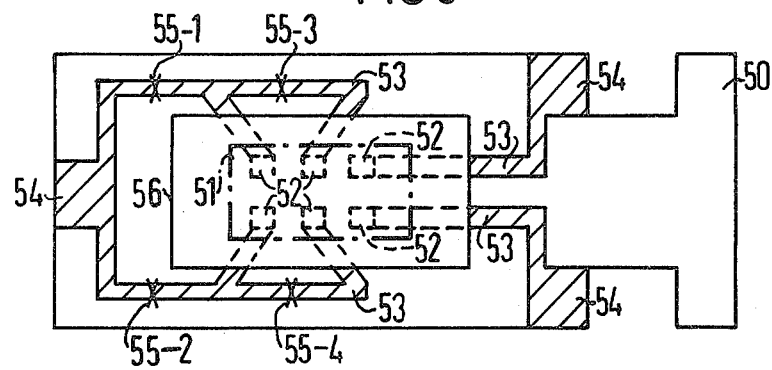
FIG. 6 is a diagrammatic partially cross-sectional view of an integrated semiconductor circuit in a so-called micropack housing with the capability of cutting conductor runs leading from the integrated semiconductor circuit system to external contact electrodes.

FIG. 6 diagrammatically illustrates an embodiment of an integrated semiconductor circuit mounted in a so-called micropack. As to the principle of assembling systems of integrated semiconductor circuits in micropacks, "Siemens Bautsils Report" 16 (1978), No. 2, pages 40 to 44 is referred to.

In such a micropack, a semiconductor system 51 containing contact electrodes 52 is applied to a micropack film 50, on which a conductor run pattern 53 with contact pads 54 for the integrated circuit is preproduced or preformed. The conductor runs 53 make contact with the contact electrodes 52 of the semiconductor system 51. The semiconductor system 51 contains a non-illustrated compensating resistor network in the sense of the embodiments according to the above-described figures, the network being accessible electrically through the conductor runs 53. Trimming to compensate locked-up mechanical stresses after assembly of the semiconductor system 51 in the micropack can be accomplished by cutting certain conductor runs 53 in the micropack. Such cutting possibilities are depicted by way of example by crosses 55-1 to 55-4 in FIG. 6. The conductor runs may be cut by punching, for example.

If a micropack of the hereinafore-described kind is processed even further, such as by assembling it in a plastic housing of conventional type, a further improvement of the compensation of locked-up mechanical stresses, such as due to temperature stresses, is achievable by covering the semiconductor system 51 with a nonmagnetic metal cap 56 such as of aluminum or brass. Such a cap offers the additional advantage of ensuring an additional shielding effect against electrical fields, in the application of the circuits to the electronics of motor vehicles, for example.

There are claimed:

1. Device for changing the electrical circuit configuration of integrated semiconductor circuits on chips for the adjustment and trimming of circuit parameters, comprising circuit connections selectively disposed in the circuit configuration of the integrated semiconductor circuits, said circuit connections being accessible from outside the circuit chips and being mechanically openable without mechanically and without electrically stressing and modifying the circuit chips, an integrated semiconductor circuit having electrical interference signals caused by stored mechanical stresses, an evaluation circuit following said semiconductor circuit, and a balancing resistor network disposed in said evaluation circuit, said circuit connections being in the form of bridges connected to resistors of said resistor network and being mechanically openable for selectively adjusting resistance values of said resistor network and compensating said interference signals.

2. Device according to claim 1, wherein said semiconductor circuit is a magnetic field-controlled circuit having a Hall-effect generator as a magnetic-electrical sensor, and said evaluation circuit is an amplifier.

3. Device according to claim 1, wherein said evaluation circuit is an amplifier having a load circuit and said resistor network is disposed in said load circuit.

4. Device according to claim 1 or 3, including a micropack in which said integrated circuit is mounted, contact pads disposed in said micropack and conductor runs leading to said contact pads, said circuit connections being operable to disconnect said conductor runs for the selective adjustment of resistance values of said balancing resistor network.

5. Device according to claim 4, including a non-magnetic metal cap disposed in said micropack covering said integrated circuit.

* * * * *